(12) United States Patent
Mok et al.

(10) Patent No.: US 7,653,991 B2
(45) Date of Patent: Feb. 2, 2010

(54) METHOD FOR MANUFACTURING PRINTED CIRCUIT BOARD HAVING EMBEDDED COMPONENT

(75) Inventors: Jee-Soo Mok, Yongin-si (KR); Jun-Heyoung Park, Hwaseong-si (KR); Ki-Hwan Kim, Suwon-si (KR); Sung-Yong Kim, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 81 days.

(21) Appl. No.: 12/007,242

(22) Filed: Jan. 8, 2008

(65) Prior Publication Data

US 2008/0263860 A1 Oct. 30, 2008

(30) Foreign Application Priority Data

Apr. 30, 2007 (KR) .................. 10-2007-0041983

(51) Int. Cl.
*H05K 3/02* (2006.01)
(52) U.S. Cl. ................... 29/847; 29/831; 29/858; 29/841; 29/832; 29/855; 29/842; 361/793; 174/262

(58) Field of Classification Search ................ 29/830, 29/831, 847, 858, 841, 855, 842, 832; 361/793; 174/262
See application file for complete search history.

(56) References Cited

U.S. PATENT DOCUMENTS

2005/0048759 A1* 3/2005 Hsu ........................ 438/618
2006/0068332 A1* 3/2006 Chen ....................... 430/312

* cited by examiner

*Primary Examiner*—Derris H Banks
*Assistant Examiner*—Dan D Le

(57) ABSTRACT

A method for manufacturing a printed circuit board having an embedded component is disclosed. The method includes: forming at least one contact bump and at least one electrode bump on one side of a base substrate; mounting the component such that the electrode bump is in correspondence with a contact terminal of the component; stacking an insulation layer, in which an opening is formed in correspondence to the component, on the one side of the base substrate, such that the contact bump penetrates the insulation layer; filling a filler in the opening; and stacking a metal layer on the insulation layer. Using the method, the reliability of circuit connections between the component and the circuit patterns can be improved, and the manufacturing process can be reduced in embedding the component in the printed circuit board.

8 Claims, 16 Drawing Sheets

METHOD FOR MANUFACTURING PRINTED CIRCUIT BOARD HAVING EMBEDDED COMPONENT

CROSS-REFERENCE TO RELATED APPLICATIONS

This application claims the benefit of Korean Patent Application No. 10-2007-0041983 filed with the Korean Intellectual Property Office on Apr. 30, 2007, the disclosure of which is incorporated herein by reference in its entirety.

BACKGROUND

1. Technical Field

The present invention relates to a method for manufacturing a printed circuit board that has embedded components.

2. Description of the Related Art

The development of the printed circuit board having embedded components is currently receiving attention as a part of next-generation multi-functional miniature packaging technology. Along with these advantages of multi-functionality and miniature sizes, the printed circuit board having embedded components also provide an aspect of higher performance, as it can minimize wiring distances in high frequencies of 100 MHz or greater, and in some cases, can improve reliability in the connection of parts utilizing wire bonding or solder balls as used in FC (flip chip) assemblies and BGA's (ball grid arrays).

FIG. 1A through FIG. 1G are cross-sectional views representing a flow diagram of a method of manufacturing a printed circuit board having an embedded component according to the related art. To manufacture a printed circuit board having an embedded component according to the related art, a printed circuit board is first fabricated, in which vias 102 are formed for electrical connection between layers and circuit patterns 104 are formed on either side. Afterwards, a cavity 106 is perforated in the position where the component 110 will be embedded, and a first insulation 108 is stacked at the lower surface of the perforated cavity 106, to insert and secure the component 110 through the cavity 106 onto the first insulation 108. When the component 110 is secured in the printed circuit board, a second insulation 112 is stacked on the printed circuit board.

Next, via holes 114 are perforated in the first insulation 108 and the second insulation 112 for electrical connection with the contact terminals 118 of the component, and copper plating 116 is applied. Here, the contact terminals 118 are made to face the upper surface of the printed circuit board and that the via holes 114 are formed in positions corresponding to the contact terminals 118 of the component after the second insulation 112 is stacked.

As such, the method of manufacturing a printed circuit board having embedded components according to the related art entails a very complicated manufacturing process, that includes such procedures as first fabricating a printed circuit board having circuit patterns on both sides and vias for inter-layer connection, perforating cavities, embedding the components, and forming vias to electrically connect the contact terminals of the component with the circuit patterns.

SUMMARY

An aspect of the invention is to provide a method for manufacturing a printed circuit board having embedded components, which reduces the manufacturing process and improves reliability in circuit connections.

One aspect of the invention provides a method for manufacturing a printed circuit board having an embedded component. The method includes: forming at least one contact bump and at least one electrode bump on one side of a base substrate; mounting the component such that the electrode bump is in correspondence with a contact terminal of the component; stacking an insulation layer, in which an opening is formed in correspondence to the component, on the one side of the base substrate, such that the contact bump penetrates the insulation layer; filling a filler in the opening; and stacking a metal layer on the insulation layer.

The method for manufacturing a printed circuit board having an embedded component can further include forming a circuit pattern by selectively removing the metal layer.

Also, if the base substrate is a metal plate, an operation of forming a circuit pattern by selectively removing the metal plate may further be included.

After mounting the component, an operation may further be included of curing the contact bump and the electrode bump.

Forming the contact bump and the electrode bump can include stacking a mask, in which a plurality of holes are formed, on the one side of the base substrate; applying a conductive paste on the mask and squeegeeing; and removing the mask.

The plurality of holes can be formed in correspondence to the contact bump and the electrode bump, where the hole corresponding to the contact bump may be greater than the hole corresponding to the electrode bump.

The mask may be made of stainless steel or aluminum (Al).

The conductive paste may contain at least one or more element selected from a group consisting of gold, silver, platinum, nickel, copper, and carbon.

The base substrate can be a circuit board, in which a circuit pattern is formed.

Additional aspects and advantages of the present invention will be set forth in part in the description which follows, and in part will be obvious from the description, or may be learned by practice of the invention.

DETAILED DESCRIPTION

Figure 1A:
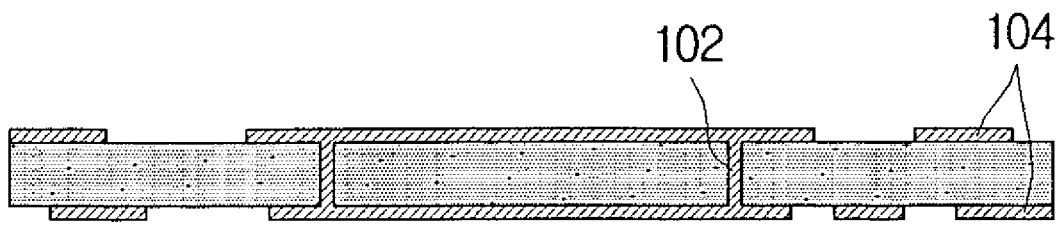
FIG. 1A, FIG. 1B, FIG. 1C, FIG. 1D, FIG. 1E, FIG. 1F, and FIG. 1G are cross-sectional views representing a flow diagram of a method of manufacturing a printed circuit board having an embedded component according to the related art.
Figure 1B:
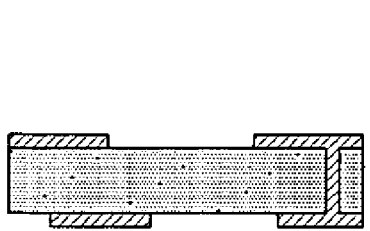
Figure 1B:
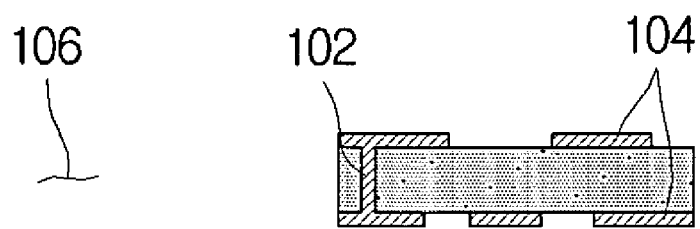
Figure 1C:
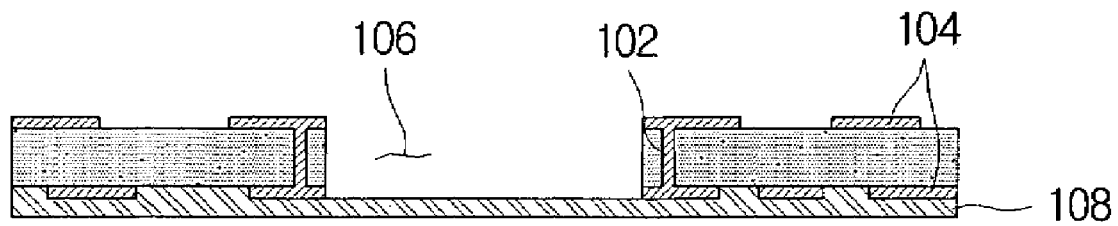
Figure 1D:
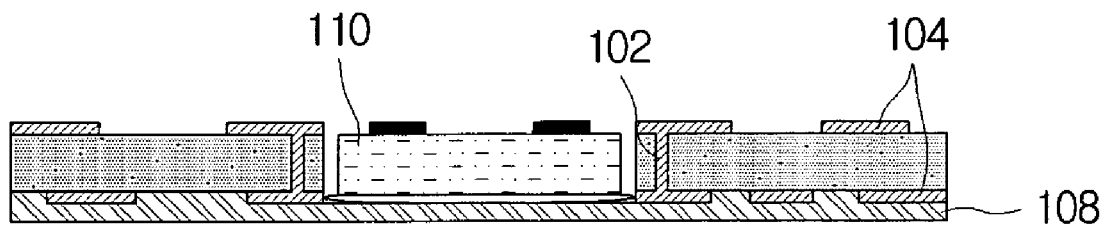
Figure 1E:
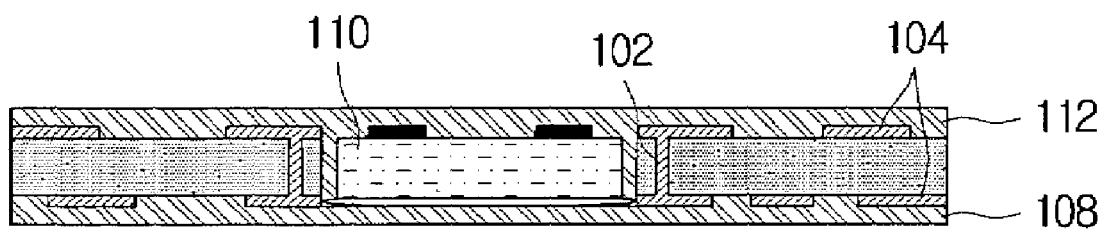
Figure 1F:
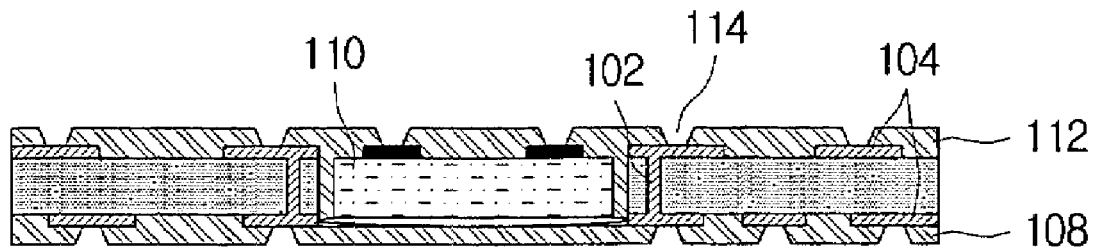
Figure 1G:
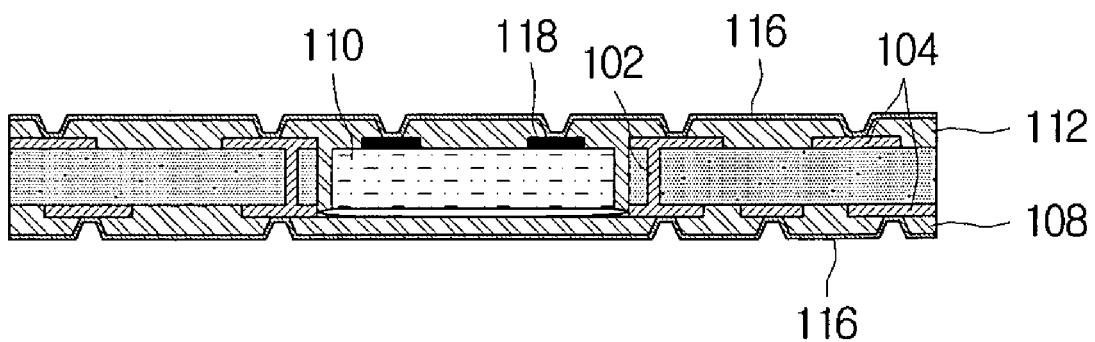

The method for manufacturing a printed circuit board having embedded components according to certain embodiments of the invention will be described below in more detail with reference to the accompanying drawings, in which those elements are rendered the same reference numeral that are the same or are in correspondence, regardless of the figure number, and redundant explanations are omitted.

Figure 2:
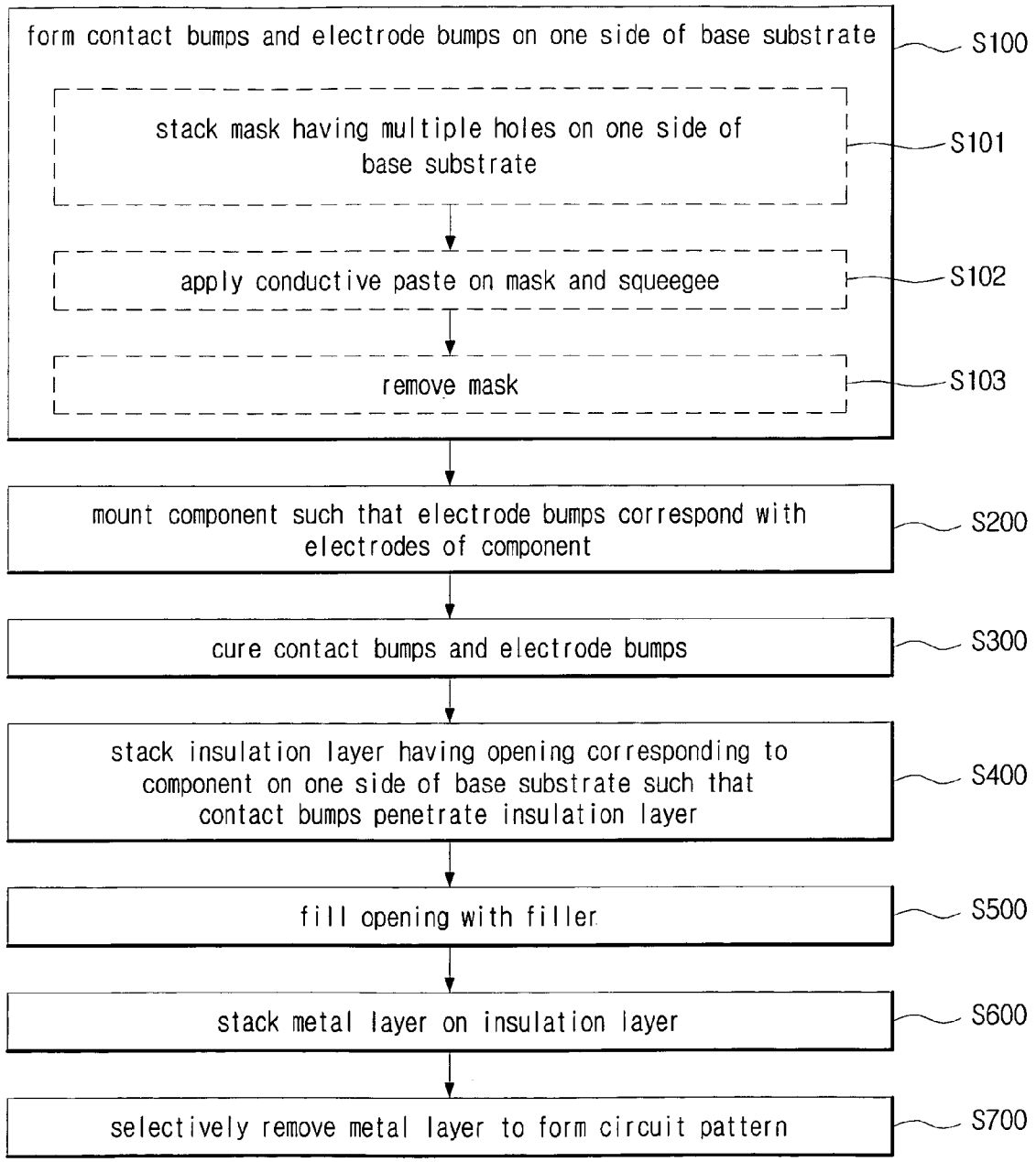
FIG. 2 is a flowchart of a method of manufacturing a printed circuit board having an embedded component according to an embodiment of the invention.

FIG. 2 is a flowchart of a method of manufacturing a printed circuit board having an embedded component according to an embodiment of the invention, while FIG. 3A through FIG. 3G are cross-sectional views representing a flow diagram of a method of manufacturing a printed circuit board having an embedded component according to an embodiment of the invention. In FIGS. 3A to 3G are illustrated holes 11, a mask 12, a metal plate 14, contact bumps 16, electrode bumps 18, a component 20, contact terminals 21, an insulation layer 22, a filler 24, a metal layer 26, and circuit patterns 28.

A method for manufacturing a printed circuit board having an embedded component according to this embodiment may include forming contact bumps 16 and electrode bumps 18 on one side of a base substrate, mounting a component 20 such that the electrodes of the component 20 and the electrode bumps 18 are in correspondence, stacking an insulation layer 22, which has an opening formed in correspondence with the component 20, on one side of the base substrate such that the contact bumps 16 penetrate the insulation layer 22, filling the opening with a filler 24, and stacking a metal layer 26 on the insulation layer 22. The method can be used to reduce the manufacturing process when embedding the component 20 inside the printed circuit board, and to improve reliability in the circuit connection between the component 20 and the circuit pattern 28.

Figure 3A:
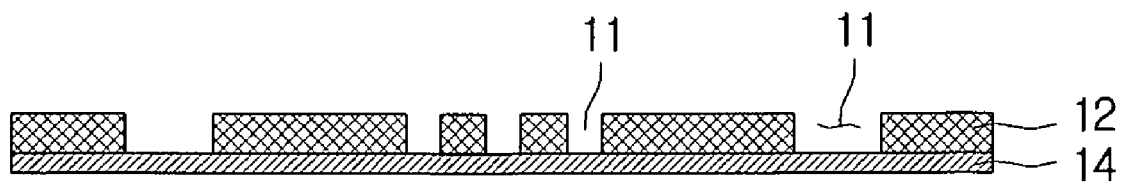
FIG. 3A, FIG. 3B, FIG. 3C, FIG. 3D, FIG. 3E, FIG. 3F, and FIG. 3G are cross-sectional views representing a flow diagram of a method of manufacturing a printed circuit board having an embedded component according to an embodiment of the invention.
Figure 3B:
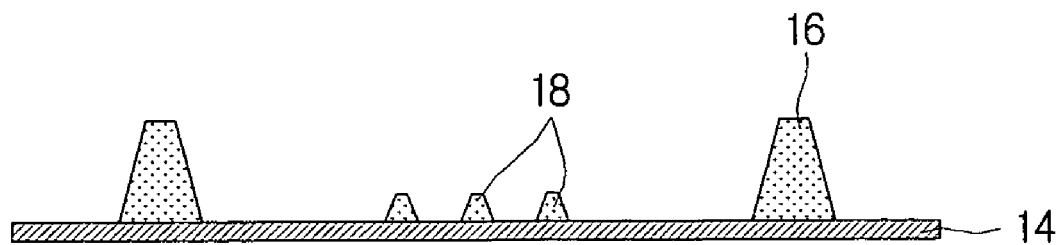

In the method for manufacturing a printed circuit board having an embedded component according to this embodiment, first, as illustrated in FIG. 3B, contact bumps 16 and electrode bumps 18 may be formed on one side of a base substrate (S100). The base substrate can be a circuit board in which circuit patterns are formed, or can be a metal plate 14. That is, the printed circuit board having embedded components 20 according to this embodiment can be added to a circuit board already having circuit patterns, to form a multi-layered printed circuit board having embedded components 20. Alternately, components 20 can be mounted on a metal plate 14 to manufacture a printed circuit board having embedded component 20.

The present embodiment will be described for a method of embedding a component 20 to manufacture a printed circuit board where the base substrate is a metal plate 14.

The metal plate 14 may used to form the circuit patterns 28 by a subsequent process of selective etching, and may be fabricated by processing a metal capable of electrical conduction into a plate shape. A copper plate can be used for the metal plate 14.

The contact bumps 16 can be made to penetrate the insulation layer 22 later when stacking the insulation layer 22, and in a subsequent process can be made to electrically connect the circuit patterns 28 formed on the one side and the other side of the insulation layer 22.

The electrode bumps 18 can be used for the electrical connection between the contact terminals 21 of the component 20 embedded in the printed circuit board and the circuit patterns 28, and thus may be formed in positions corresponding to the contact terminals 21 of the component 20 that will be mounted later. Therefore, the electrode bumps 18 can be formed such that the electrode bumps 18 and the contact terminals 21 of the component 20 face each other.

A method of forming the contact bumps 16 and the electrode bumps 18 on the metal plate 14 may include, first, as illustrated in FIG. 3A, stacking a mask 12 having several holes 11 on one side of the metal plate 14 (S101). The several holes 11 may be formed in positions corresponding to where the contact bumps 16 and electrode bumps 18 will be formed on the metal plate 14 when the mask 12 is stacked over the metal plate 14. Here, the holes 11 for forming the contact bumps 16 may be greater than the holes 11 for forming the electrode bumps 18. As the contact bumps 16 may be formed to penetrate through the insulation layer 22 stacked onto the metal plate 14, while the electrode bumps 18 may be formed to be electrically connected with the contact terminals 21 of the component 20 embedded in the insulation layer 22, the holes 11 by which to form the electrode bumps 18 can be smaller than the holes 11 by which to form the contact bumps 16.

The mask 12 can be made of a metallic material such as stainless steel and aluminum, etc., that has a low elongation ratio.

After stacking the mask 12 on the metal plate 14, conductive paste (not shown) may be applied on the mask 12 and squeegeeing can be performed (S102). The squeegeeing can force the conductive paste into the plurality of holes 11.

The conductive paste can be made as a mixture of conductive particles, including at least one or more conductive material selected from a group consisting of gold, silver, platinum, nickel, copper, carbon, etc., and a synthetic resin or epoxy resin. The synthetic resin or epoxy resin may serve as a binder for binding the conductive particles. Here, metal binders can be used, as well as organic binders. Bismuth (Bi), etc., can be used as a metal binder. When a conductive paste is placed under high temperatures and high pressures, the conductive particles may be placed in contact with one another, thus providing electrical or thermal conduction. It is possible to obtain the conductive qualities while applying heat and pressure by metal diffusion or curing.

When the conductive paste is forced into the plurality of holes 11 by squeegeeing, the mask 12 may be removed from the metal plate 14 such that the conductive paste is transferred to the metal plate 14, whereby the contact bumps 16 and electrode bumps 18 may be formed (S103). In order that the conductive paste may readily be separated from the mask 12 and transferred to the metal plate 14, a demolding material may be applied to the mask 12 before applying the conductive paste.

Figure 3C:
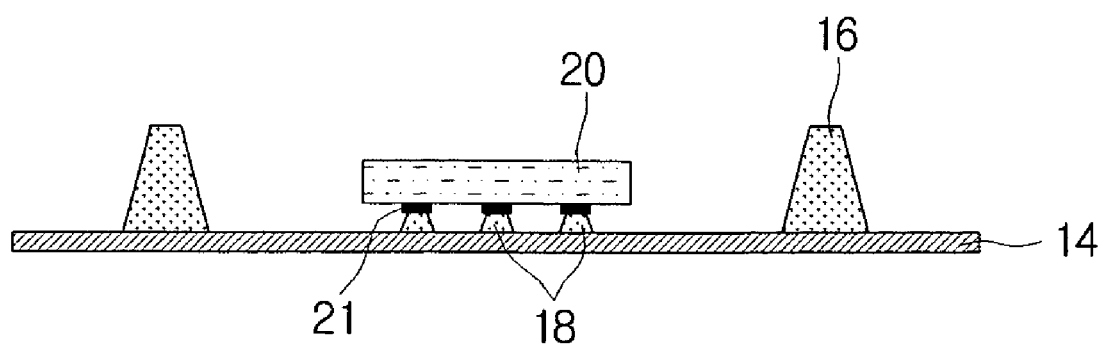

Next, as illustrated in FIG. 3C, the component 20 may be mounted on the electrode bumps 18 of the metal plate 14 such that the electrode bumps 18 formed on the metal plate 14 and the contact terminals 21 of the component 20 are in correspondence to each other (S200). Various types of component 20, such as a resistor, capacitor, integrated circuit, semiconductor chip, etc., can be embedded as the component 20 of this embodiment in the printed circuit board.

By thus embedding various types of components 20 in the printed circuit board, the board area can be decreased, and the components 20 can be utilized in high densities, thereby allowing the implementation of electronic equipment that requires high-speed operations, such as mobile terminals and laptops, etc.

Next, the contact bumps 16 and the electrode bumps 18 may be cured (S300). Since the contact bumps 16 may later penetrate the insulation layer 22, the contact bumps 16 may be cured to above a particular rigidity, and since the electrode bumps 18 are placed in correspondence with the contact terminals 21 of the component 20, the electrode bumps 18 may be cured to increase the adhesion between the electrode bumps 18 and the contact terminals 21 of the component 20.

Figure 3D:
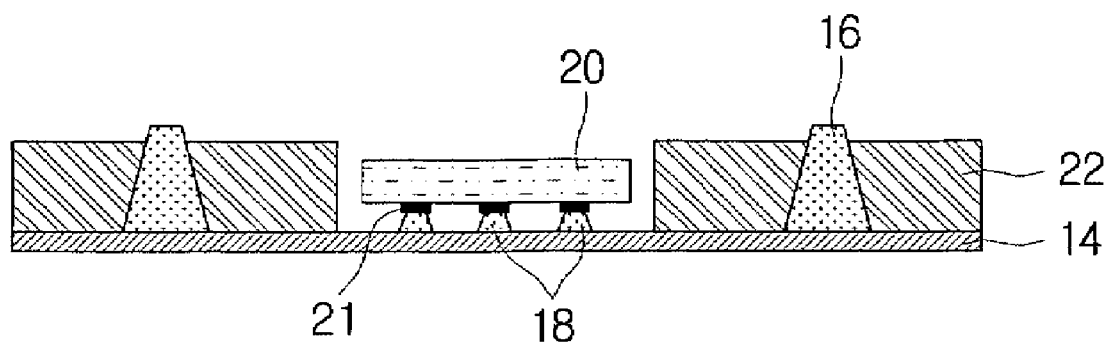

Next, as illustrated in FIG. 3D, an insulation layer 22, which has an opening formed in a position corresponding to the component 20, may be stacked on the side of the metal plate 14 on which the component 20 is mounted, such that the contact bumps 16 penetrate the insulation layer 22 (S400). Here, the insulation layer 22 can contain at least one of thermoplastic resin and glass epoxy resin, and may be in a deformable state when it is stacked. For example, the insulation layer 22 can be made deformable by raising the temperature to above the transition temperature of the thermoplastic resin or glass epoxy resin, after which the insulation layer 22 can be stacked such that the contact bumps 16 penetrate the insulation layer 22. It is also possible to use prepreg for the insulation layer 22, in which glass fibers are impregnated in a thermosetting resin to provide a semi-cured state.

An opening may be formed in the insulation layer 22 in a position corresponding to the component 20. As the component 20 may be mounted on the metal plate 14, the insulation layer 22 may be stacked on the metal plate 14 with the opening formed beforehand, so that the component 20 may be exposed through the opening. The insulation layer 22 can be made sufficiently thick, such that the component 20 mounted on the electrode bumps 18 may be embedded in the insulation layer 22 when a filler 24 is later filled in.

Figure 3E:
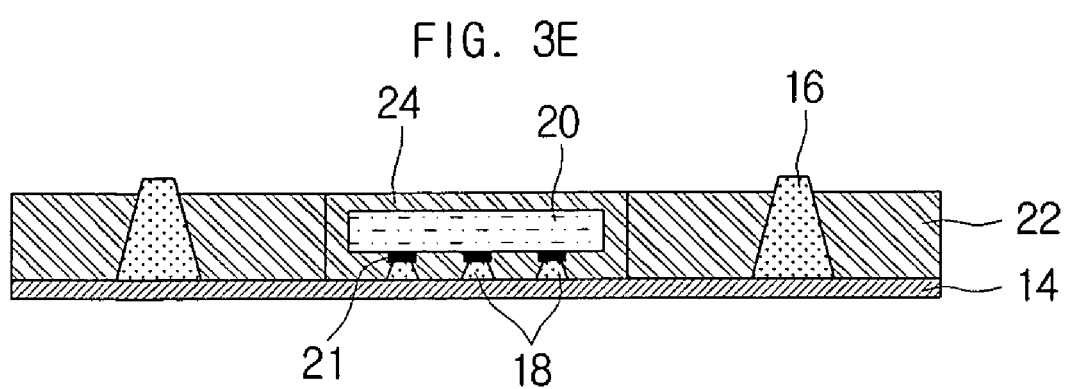

Next, as illustrated in FIG. 3E, a filler 24 may be filled in the opening through which the component 20 is exposed (S500). The filler 24 can fill the space remaining inside the opening after the component 20 is embedded. An insulating material such as epoxy resin, etc., can be used for the filler 24. By using the filler 24, the component 20 can be firmly secured and can be embedded inside the insulation layer 22.

Figure 3F:
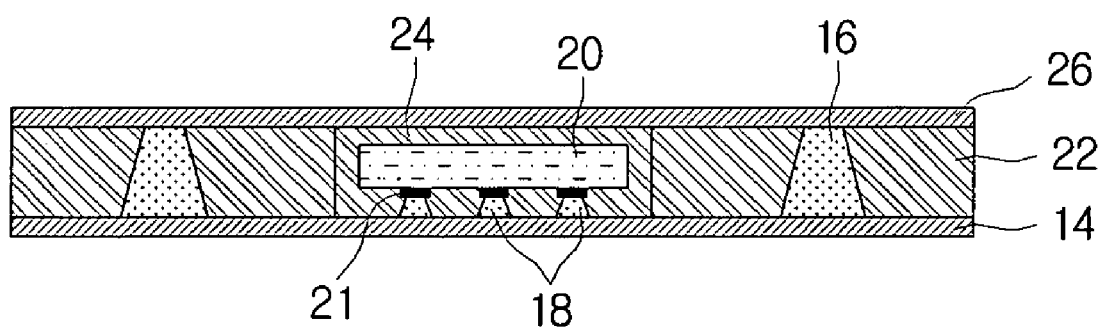

Next, as illustrated in FIG. 3F, a metal layer 26 may be stacked on the insulation layer 22 (S600). A method of stacking the metal layer 26 may include attaching a metal panel, or depositing a metal by plating, etc., to form the metal layer 26. The metal layer 26 can be used later to form a circuit pattern 28 by selectively etching the metal layer 26.

Figure 3G:
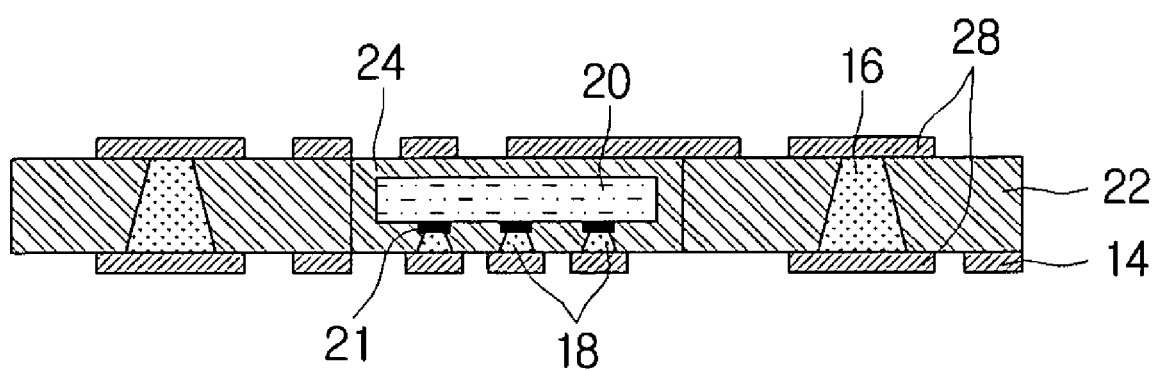

Next, as illustrated in FIG. 3G, when the metal layer 26 is stacked on the insulation layer 22, the metal plate 14 formed on one side of the insulation layer 22 and the metal layer 26 formed on the other side of the insulation layer 22 may be selectively etched to form circuit patterns 28 (S700).

Figure 4:
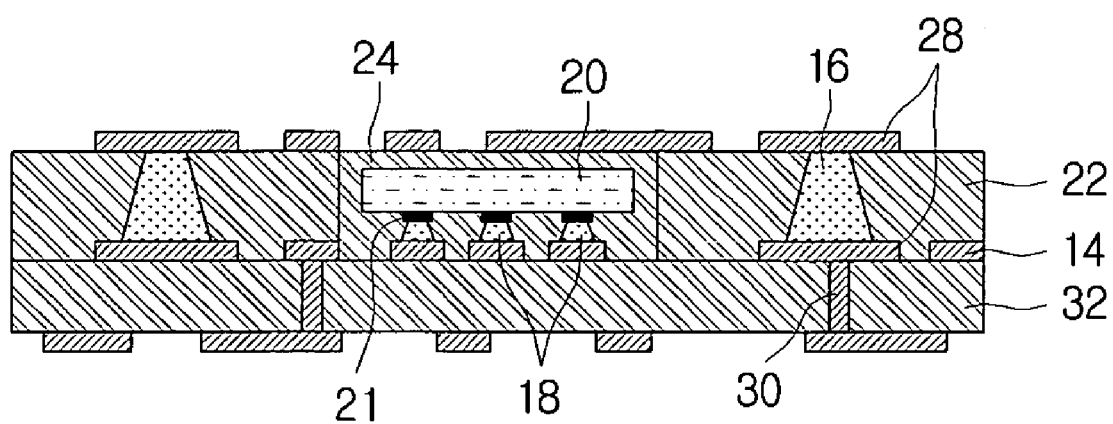
FIG. 4 is a cross-sectional view of a printed circuit board having an embedded component according to another embodiment of the invention.

FIG. 4 is a cross-sectional view of a printed circuit board having an embedded component according to another embodiment of the invention. In FIG. 4 are illustrated contact bumps 16, electrode bumps 18, a component 20, circuit patterns 28, and a circuit board 32.

In this embodiment, a circuit board 32 having a circuit pattern may be used as the base substrate to form a printed circuit board having a component 20 embedded in one side.

On the circuit board 32, a circuit pattern may be formed that includes lands, on which the contact bumps 16 and electrode bumps 18 will be formed. The contact bumps 16 and the electrode bumps 18 may be formed on these lands using a mask 12. After mounting the component 20 such that the electrode bumps 18 are in correspondence with the contact terminals 21 of the component 20, an insulation layer 22 in which an opening is formed may be stacked on the circuit board 32. When the insulation layer 22 is stacked on, a filler 24 can be filled in the opening, and a metal layer 26 may be stacked on the insulation layer 22. Afterwards, the metal layer 26 may be selectively etched to form a circuit pattern 28, to manufacture a printed circuit board that has an embedded component 20.

While this embodiment is described for a circuit board 32 that has circuit patterns formed on both sides, it is possible also to use a circuit board 32 that has a circuit pattern formed on one side only. It is also possible to manufacture a printed circuit board having embedded components 20 according to the method described above with a multi-layered circuit board having multiple layers of circuit patterns.

By utilizing certain embodiments of the invention as set forth above, the reliability of circuit connections between the component and the circuit patterns can be improved, and the manufacturing process can be reduced in embedding the component in the printed circuit board.

Also, the board area can be decreased, and the components can be utilized in high densities, whereby it is possible to implement electronic equipment that requires high-speed operations, such as mobile terminals and laptops, etc.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method for manufacturing a printed circuit board having an embedded component, the method comprising:
    forming at least one contact bump and at least one electrode bump on one side of a base substrate;
    mounting the component such that the electrode bump is in correspondence with a contact terminal of the component;
    stacking an insulation layer on the one side of the base substrate such that the contact bump penetrates the insulation layer, the insulation layer having formed therein an opening corresponding to the component;
    filling a filler in the opening;
    stacking a metal layer on the insulation layer; and
    forming a circuit pattern by selectively removing the metal layer.

2. The method of claim 1, wherein the base substrate is a metal plate, and the method further comprises:
    forming a circuit pattern by selectively removing the metal plate.

3. The method of claim 1, further comprising, after mounting the component:
    curing the contact bump and the electrode bump.

4. The method of claim 1, wherein forming the contact bump and the electrode bump comprises:
    stacking a mask on the one side of the base substrate, the mask having a plurality of holes formed therein;
    applying a conductive paste on the mask and squeegeeing the mask; and
    removing the mask.

5. The method of claim 4, wherein the plurality of holes are formed in correspondence to the contact bump and the electrode bump, and wherein
    the hole corresponding to the contact bump is greater than the hole corresponding to the electrode bump.

6. The method of claim 4, wherein the mask is made of stainless steel or aluminum (Al).

7. The method of claim 4, wherein the conductive paste contains at least one or more element selected from a group consisting of gold, silver, platinum, nickel, copper, and carbon.

8. The method of claim 1, wherein the base substrate is a circuit board having a circuit pattern formed therein.

* * * * *